United States Patent [19]

Liu

[11] Patent Number: 4,689,495

[45] Date of Patent: Aug. 25, 1987

[54] CMOS HIGH VOLTAGE SWITCH

[75] Inventor: Wei-Ti Liu, San Jose, Calif.

[73] Assignee: Advanced Micro Devices, Inc., Sunnyvale, Calif.

[21] Appl. No.: 745,568

[22] Filed: Jun. 17, 1985

[51] Int. Cl.$^4$ ............... H03K 17/10; H03K 17/687; H03K 19/094; G11C 11/40

[52] U.S. Cl. ............... 307/264; 307/475; 307/585; 307/482; 307/578; 365/228; 365/104

[58] Field of Search ............... 307/450–453, 307/475, 575, 576, 579, 584, 585, 270, 264, 482, 578, 262; 365/104, 226, 228

[56] References Cited

U.S. PATENT DOCUMENTS

| | | | |
|---|---|---|---|
| 4,441,172 | 4/1984 | Ebel | 365/226 |
| 4,442,481 | 4/1984 | Brahmbhatt | 365/226 X |
| 4,467,457 | 8/1984 | Iwahashi et al. | 365/228 |
| 4,601,020 | 7/1986 | Arakawa et al. | 365/226 |
| 4,612,462 | 9/1986 | Asano et al. | 365/226 X |
| 4,616,143 | 10/1986 | Miyamoto | 365/226 X |
| 4,638,182 | 1/1987 | McAdams | 307/585 X |

Primary Examiner—Stanley D. Miller
Assistant Examiner—David R. Bertelson
Attorney, Agent, or Firm—Patrick T. King; Davis Chin

[57] ABSTRACT

A CMOS high voltage switch for interfaceing between a decoder output and an input to an erasable, programmable read-only-memory includes an inverter for receiving an input signal from the output of the decoder. A N-channel MOS pass transistor has a conduction path and a gate electrode. One end of the conduction path is connected to the output of the inverter, and the other end of the conduction path is connected to an output node. The gate electrode of the pass transistor is connected to a first lower supply potential. A pumping device is connected to the other end of the conduction path for pumping the output node to a first higher voltage during a first mode of operation. A P-channel MOS switching transistor is also connected to the other end of the conduction path for switching the output node to a second lower voltage during a second mode of operation.

15 Claims, 2 Drawing Figures

CMOS HIGH VOLTAGE SWITCH

BACKGROUND OF THE INVENTION

This invention relates generally to switching circuits, and more particularly, it relates to a complementary metal-oxide-semiconductor (CMOS) high voltage switch for interfacing between a decoder output and an input to an erasable, programmable read-only-memory (EPROM) wherein two separate signal paths are provided.

As is generally known, a high voltage is typically required when it is desired to program or write an EPROM cell and a low voltage is typically required when it is desired to read an EPROM cell. A conventional CMOS high voltage switch adapted for connection between a decoder output and an EPROM cell is illustrated in FIG. 1 of the drawings and has been labelled "Prior Art". This prior art switch suffers from the disadvantage that both the low voltage signal path and the high voltage signal path are through the same transistors; namely, P-channel MOS transistor P4 and N-channel MOS transistor N3. Due to the fact that these transistors are connected in series, their turn-on resistance values are relatively high. As a result, the operating speed of the switch is relatively slow. Further, during the low voltage operation the voltage at the output node 4 will be one threshold voltage drop below the supply potential VCC. Therefore, the full supply potential will not be obtainable at the output node without modifying the switch design to include intrinsic or depletion-mode type transistors. However, the increased processing cost in fabricating such transistors makes this design change unacceptable.

It would therefore be desirable to provide a high voltage switch implemented with all MOS transistors for providing a first signal path to accommodate a high voltage during a first or programming mode of operation and a second signal path to accommodate a low voltage during a second or read mode of operation, thereby increasing its speed of operation and improving latch-up immunity.

SUMMARY OF THE INVENTIONAL

Accordingly, it is a general object of the present invention to provide an improved CMOS high voltage switch which has an increased speed of operation and an improved latch-up immunity.

It is an object of the present invention to provide a CMOS high voltage switch for interfacing between a decoder output and an input to an erasable, programmable read-only-memory which has two separate signal paths.

It is another object of the present invention to provide a CMOS high voltage switch which has a first signal path to accommodate a high voltage during a programming mode of operation and a second signal path to accommodate a low voltage during a read mode of operation.

It is still another object of the present invention to provide a CMOS high voltage switch which includes a switching device connected to an output node for allowing the output node to be pumped up to a first higher voltage during a first mode of operation and for maintaining the output node at a second lower voltage during a second mode of operation.

It is still yet another onject of the present invention to provide a CMOS high voltage switch which includes a switching device formed of a P-channel MOS switching transistor and a P-channel MOS current-limiting transistor for switching an output node between first and second modes of operation.

In accordance with these aims and objectives, the present invention is concerned with the provision of a CMOS high voltage switch for interfacing between a decoder output and an input to an erasable, programmable read-only-memory which includes an input means for receiving an input signal from the output of the decoder. A control device is provided which has a conduction path and a gate electrode. One end of the conduction path is connected to the output of the input means. The other end of the conduction path is connected to an output node. The gate electrode is connected to a supply potential. A pumping means is connected to the other end of the conduction path for pumping the output node to a first higher voltage during a first mode of operation. Switching means is also connected to the other end of the conduction path for switching the output node to a second lower voltage during a second mode of operation.

BRIEF DESCRIPTION OF THE DRAWINGS

These and other objects and advantages of the present invention will become more fully apparent from the following detailed description when read in junction with the accompanying drawings with like reference numerals indicating corresponding parts throughout, wherein.

DESCRIPTION OF THE PREFERRED EMBODIMENT

Figure 1:
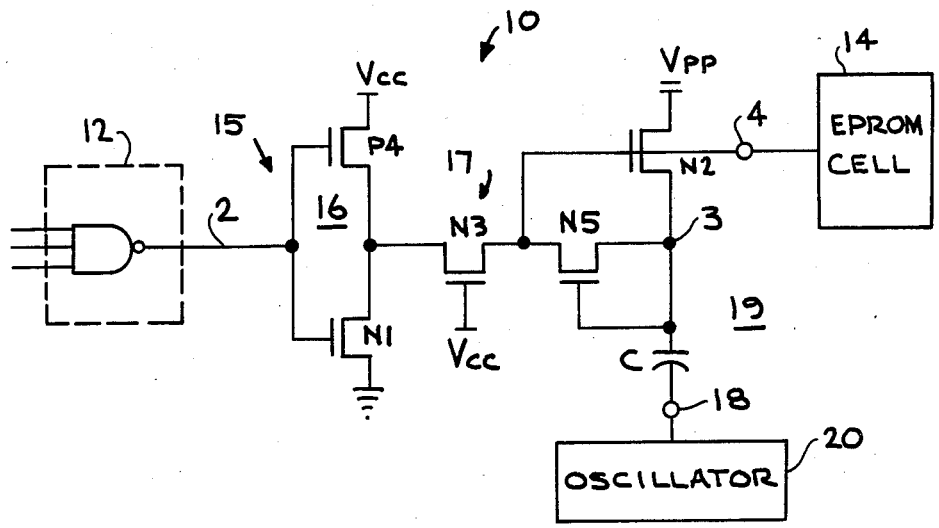
FIG. 1 is a schematic circuit diagram of a conventional CMOS high voltage switch of the prior art.

Referring now in detail to the drawings, there is illustrated in FIG. 1 a schematic circuit diagram of a conventional CMOS high voltage switch 10 of the prior art which is interconnected between the output of a decoder 12 and the input of an erasable, programmable read-only-memory (EPROM) 14. The output of the decoder at node 2 is connected to the input of the high voltage switch 10. When the decoder 12 has been selected, its output is at a low or "0" logic level on the order of 0 volts. When the decoder has not been selected, its output is at a high or "1" logic level which is approximately +5 volts. The output of the high voltage switch 10 at node 4 is connected to the input of the EPROM 14.

The high voltage switch comprises an input means 15, a control device 17, and a pumping means 19. The input means 15 consist of a CMOS inverter 16 formed of a P-channel MOS transistor P4 and a N-channel MOS transistor N1 whose gate electrodes are connected together and to the input node 2 for receiving an input signal from the decoder 12. The common gate electrodes define the input of the inverter 16. The drain electrodes of the transistors P4 and N1 are also connected together and define the output of the inverter 16. The source of the transistor P4 is connected to a first lower supply potential VCC which is typically operated at +5 volts, and the source of the transistor N1 is connected to a ground potential.

The control device 17 comprises a N-channel MOS pass transistor N3 having a conduction path and a gate electrode. The drain and source electrodes of the transistor N3 define the respective ends of the conduction path. The transistor N3 has it gate connected to the first lower supply potential VCC, its drain connected to the output of the inverter 16, and its source connected to the output node 4.

The pumping means 19 includes a N-channel MOS transistor N2 having its gate electrode connected to the source of the pass transistor N3 and its drain electrode connected to a second higher potential VPP. The second supply potential VPP is typically operated at approximately +10 volts during a program or write mode of operation and is typically operated at approximately +5 volts during a read operation. The transistor N2 serves has a current-limiting resistor. The source of the transistor N2 is connected to the drain and gate electrodes of a N-channel MOS charge transfer transistor N5 functioning as a diode and to one end of a capacitor C. The other end of the capacitor C is connected to an input node 18 for receiving pulses PUMPX from a free-running oscillator 20. The source of the charge transfer transistor N5 is connected to the source of the pass transistor N3.

During the program or first mode of operation when the second supply potential VPP is approximately volts and assuming that the decoder 12 has been selected, the P-channel transistor P4 is caused to be turned on so that the drain of the pass transistor N3 will be at the level of the first lower supply potential VCC. Since this lower supply potential VCC is also applied to the gate of the pass transistor N3, it will turn on and the output node 4 of the high voltage switch will be initially at one threshold voltage drop below the lower supply potential VCC. Further, the node 3 will be at two threshold voltage drops below the lower supply potential VCC or approximately +3 volts. This is assuming that each threshold voltage drop is approximately +1 volt. Thus, the voltage at the node 3 will begin to be pumped up by the oscillator 20 via the capacator C from this voltage of approximately +3 volts. The voltage at node 4 will be pumped toward the second supply potential VPP and will reach the same in its final condition.

During the read or second mode of operation when the second higher supply potential is approximately +5 volts and assuming that the decoder 12 has been selected, the P-channel transistor P4 is again caused to be turned on so that the drain of the pass transistor N3 will be at the first supply potential VCC. Again, the pass transistor N3 will be turned on so that the output node 4 will remain at one threshold voltage drop below the supply potential VCC.

Thus, the input signal from the decoder 12 must be feed through the series connection of the P-channel transistor P4 and the N-channel pass transistor N3 in both the program mode of operation and the read mode of operation. Since the turn-on resistance values of the transistors P4 and N3 are relatively quite high, the operating speed of the high voltage switch 10 is reduced. Further, during the read mode the final voltage at the output node 4 does not reach the full first lower supply potential VCC due to the loss of a threshold voltage drop due to the pass transistor N3.

Figure 2:
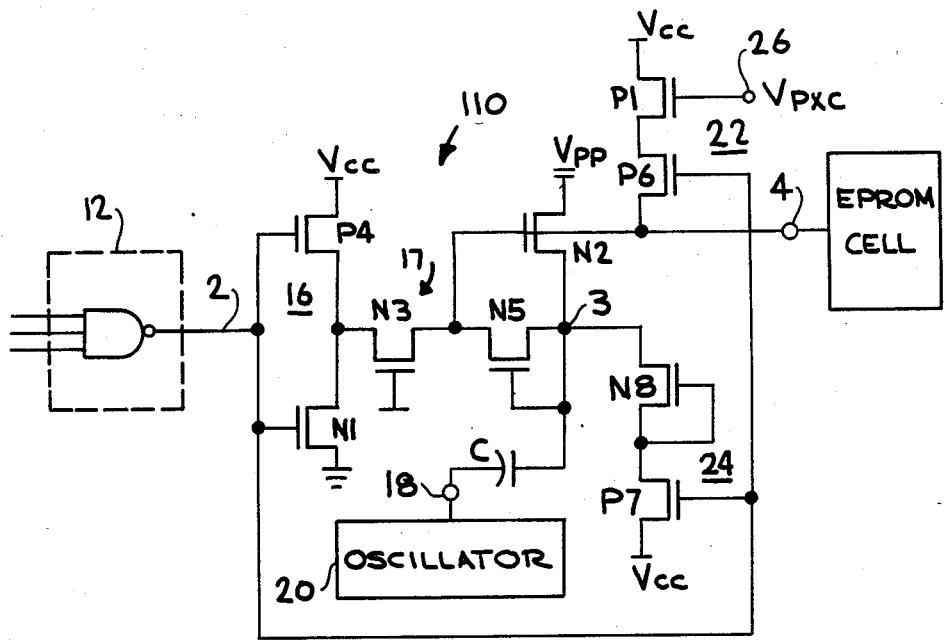
FIG. 2 is a schematic circuit diagram of a CMOS high voltage switch constructed in accordance with the principles of the present invention.

FIG. 2 is a schematic circuit diagram of a high voltage switch 110 of the present invention which is implemented with all CMOS transistors. The high voltage switch 110 is an improvement over the switch 10 of FIG. 1 and provides two separate signal paths wherein a first one is used during the programming mode of operation and a second one is used during the read mode of operation. The high voltage switch 110 comprises all of the circuit elements contained in the input means 15, the control device 17 and the pumping means 19 of the switch 10 with the additional components of three P-channel MOS transistors P1, P6 and P7 and one N-channel MOS transistor N8. The components which are the same or function in the same way as in FIG. 1 have been given the same reference numerals and are generally not explained again.

The high voltage switch 110 utilizes the switch 10 of FIG. 1 and further comprises switching means 22 and level-shifting means 24. The switching means 22 is formed by the P-channel MOS switching transistor P1 and the P-channel MOS current-limiting transistor P6. The transistor P1 has its source connected to the first lower supply potential VCC, its gate connected to a logic voltage VPXC and its drain connected to the source of the transistor P6. The gate of the transistor P6 is connected to the output of the decoder 12, and the drain of the transistor P6 is connected to the output node 4 which is connected to the gate of the transistor N2 and the source of the transistor N3.

The level shifting means 24 is formed by the P-channel MOS current-limiting transistor P7 and the N-channel MOS charge transfer transistor N8. The current-limiting transistor P7 has its source connected to the first lower supply potential VCC and its gate connected to the output of the decoder 12. The drain of the transistor P7 is connected to the gate and drain electrodes of the charge transfer transistor N8 which functions as a diode. The source of the transistor N8 is connected to the gate and drain electrodes of the N-channel charge transfer transistor N5 (node 3).

During the programming or first mode of operation, the second higher supply potential VPP will be operated at +10 volt and the logic voltage VPXC at input terminal 26 will be at a high logic level so as to turn off the switching transistor P1. With the decoder 12 being selected, the transistor P4 will be turned on so that the drain of the pass transistor N3 will be at the first lower supply potential VCC. With the gate of the transistor N3 being tied to the supply potential VCC, it will be turned on so that the output node 4 will be one threshold voltage drop below the supply potential VCC. However, the node 3 will also be at one threshold voltage drop below the supply potential VCC due to the fact that transistors P7 and N8 will be turned on. Assuming again that the threshold voltage drop is +1 volt, node 3 will be at the voltage at the node 3 will begin to be pumped up from this approximately +4 volts. As a result, the voltage of +4 volts instead of +3 volts of FIG. 1. Thus, the voltage at node 3 in FIG. 2 will be pumped up and reach the second supply potential VPP sooner than in FIG. 1 thereby effecting a higher speed of operation.

During the read or second mode of operation, the second supply potential VPP will be operated at +5 volts and the logic voltage VPXC at the input terminal 26 will be at a low logic level so as to turn on the transistor P1. Since the transistor P6 is also turned on, the full supply potential VCC will reach the output node 4 without the loss of a threshold voltage drop. As can be seen, during this second mode of operation, the input signal through the transistor P4 and the pass transistor N3 defining the first signal path is not used when the decoder 12 has been selected and is used only when the decoder has been deselected. On the contrary, with the decoder being selected a second signal path is used for turning on the switching transistor P1 so as to achieve a higher speed of operation as well as to improve latch-up immunity.

From the foregoing detailed description, it can be thus be seen that the present invention provides improved CMOS high voltage switch which includes a first signal path to accommodate a high voltage during a programming mode of operation and a second signal path to accomodate a low voltage during a read mode of operation, thereby increasing its speed of operation and improving latch-up immunity. The high voltage switch of the present invention includes switching means connected to an output node for allowing the output node to be pumped up to a first higher voltage during the first mode of operation and for switching the output mode to a second lower voltage during the second mode of operation.

While there has been illustrated and described what is at present to be a preferred embodiment of the present invention, it will be understood by those skilled in the art that various changes and modifications may be made, and equivalents may be subsituted for elements thereof without departing from the true scope of the invention. In addition, many modifications may be made to adapt a particular situation or material to the teachings of the invention without departing from the central scope thereof. Therefore, it is intended that this invention be limited to the particular embodiment disclosed as the best mode contemplated for carrying out this invention, but that the invention include all embodiments falling within the scope of the appended claims.

I claim:

1. A CMOS high voltage for interfacing between a decoder output and an input to an erasable, programmable read-only-memory comprising:
    input means for receiving an input signal from the output of one decoder;
    said input means being formed of an inverter consisting of a P-channel MOS transistor and an N-channel MOS transistor whose gate electrodes are connected together to define its input and whose drain electrodes are connected together to define its output the source of said P-channel transistor being connected to a first lower supply potential, the source of the N-channel transistor being connected to a ground potential;
    a control device having conduction path and a gate electrode, one end of the conduction path being connected to the output of said input means, the other end of the conduction path being connected to an output node, the gate electrode being connected to the first lower supply potential:
    said control device being former of an N-channel MOS pass transistor having its drain connected to the output of said inverter and its source connected to the output node:
    pump means connected to said other end of conduction gate for pumping the output node to a first higher voltage outing a first mode of operation:
    said pump means including an N-channel MOS current-limiting transistor having its drain connected to a second higher supply potential, its gate connected to the source of said base transistor, its source connected to the gate and drain electrodes of a first N-channel MOS charge transfer transistor serving as a diode and to one end of a capacitor, the source of said first charge transfer transistor being connected to the source of said pass transistor, the other end of the capacitor being connected to a free-running oscillator:
    switching means connected also to said other end of the conduction path for switching the output node to a second lower voltage during second mode of operation: and
    said switching means including a P-channel MOS switching transistor and a first P-channel MOS current-limiting transistor, said switching transistor having its source connected to the first lower supply potential, its gate connected to a logic voltage and its drain connected to source of said first P-channel current-limiting transistor, said first P-channel current-limiting transistor having its gate connected to the output of said decoder and it drain connected to the output node.

2. A switch as claimed in claim 1, wherein said logic voltage is in a high or "1" logic level to produce the first mode of operation and wherein said logic voltage is in a low or "0" logic level to produce the second mode of operation.

3. A switch as claimed in claim 2, wherein said switch means further includes a level shifting means consisting of a second P-channel MOS current-limiting transistor and a second N-channel MOS charge transfer transistor serving as a diode, said second P-channel current-limiting transistor having its source connected to the first lower supply potential, its gate connected to the output of the decoder and its drain connected to the gate and drain of the second charge transfer transistor, the source of the second charge transfer transistor being connected to the gate and drain of said first charge transfer transistor.

4. A switch as claimed in claim 3 wherein the first supply potential is approximately +5 volts and the second supply potential is approximately +10 volts.

5. A switch as claimed in claim 4, wherein the second lower voltage at the output node during the second mode of operation is near the first supply potential without the loss of a threshold voltage drop.

6. A switch as claimed in claim 5, wherein the input signal is in a low or "0" logic level when the decoder has been selected.

7. A CMOS high voltage switch for interfacing between a decoder output and an input to an erasable, programmable read-only-memory comprising:
    input means for receiving an input signal from the output of the decoder;
    a control device having a conductor path and a gate electode, one end of the conductor path being connected to the output of said input means the other end of the conduction path connected to an output node, the gate electrode being connected to a first lower supply potential;
    pumping means connected to said other end of the conduction path for pumping the output node to a first higher voltage during a first mode of operation:
    switching means including a P-channel MOS switching transistor for switching the output node to a second lower voltage during a second mode of operation, said switching transistor being responsive to a logic voltage for switching between the first and second modes of operation; and said switching means further including a first P-channel MOS current-limiting transistor, said P-channel switching transistor having its source connected to the first lower supply potential, its gate connected to the logic voltage and its grain connected to source of said first P-channel current-limiting transistor said first P-channel current-limiting transistor having its gate connected to the output of said decoder and its drain connected to the output node.

8. A switch as claimed in claim 7, wherein said input means is formed of an inverter consisting of a P-channel MOS transistor and a N-channel MOS transistor whose gate electrodes are connected together to define its input and whose drain electrodes are connected together to define its output, the source of said P-channel transistor being connected to the first lower supply potential, the source of the N-channel transistor being connected to a ground potential.

9. A switch as claimed in claim 7, wherein said control device comprises a N-channel MOS pass transistor having its drain connected to the output of said inverter and its source connected to the output node.

10. A switch as claimed in claim 9, wherein said pump means includes an N-channel MOS current-limiting transistor having its drain connected to a second higher supply potential, its gate connected to the source of said pass transistor, its source connected to the gate and the drain electrodes of a first N-channel MOS charge transfer transistor serving as a diode and to one end of a capacitor, the source of said first charge transfer transistor being connected to the source of said pass transistor, the other end of the capacitor being connected to a free-running oscillator.

11. A switch as claimed in claim 7, wherein said logic voltage is in a high or "1" logic level to produce the first mode of operation and wherein said logic voltage is in a low or "0" logic level to produce the second mode of operation.

12. A switch as claimed in claim 11, wherein said switch means further includes a level shifting means consisting of a second P-channel MOS current-limiting transistor and a second N-channel MOS charge transfer transistor serving as a diode, said second P-channel current-limiting transistor having its source connected to the first lower supply potential, its gate connected to the output of the decoder and its drain connected to the gate and drain of the second charge transfer transistor, the source of the second charge transfer transistor being connected to the gate and drain of said first charge transfer transistor.

13. A switch as claimed in claim 10, wherein the first supply potential is approximately +5 volts and the second supply potential is approximately +10 volts.

14. A switch as claimed in claim 13, wherein the second lower voltage at the output node during the second mode of operation is near the first supply potential without the loss of a threshold voltage drop.

15. A switch as claimed in claim 7, wherein the input signal is in a low or "0" logic level when the decoder has been selected.

* * * * *